US009723710B2

(12) United States Patent
Woodford et al.

(10) Patent No.: US 9,723,710 B2
(45) Date of Patent: Aug. 1, 2017

(54) ANTI-TAMPER DEVICE

(71) Applicant: Johnson Electric S.A., Murten (CH)

(72) Inventors: Anthony Neil Woodford, Wootton (GB); Martin Wallace Edmonds, East Cowes (GB); Alan Roger Morey, Shanklin (GB)

(73) Assignee: Johnson Electric S.A., Murten (CH)

( * ) Notice: Subject to any disclaimer, the term of this patent is extended or adjusted under 35 U.S.C. 154(b) by 153 days.

(21) Appl. No.: 14/832,294

(22) Filed: Aug. 21, 2015

(65) Prior Publication Data

US 2016/0057856 A1 Feb. 25, 2016

(30) Foreign Application Priority Data

Aug. 22, 2014 (GB) .................................. 1414951.2

(51) Int. Cl.
| | |
|---|---|
| H05K 1/02 | (2006.01) |
| H05K 1/18 | (2006.01) |
| H05K 1/16 | (2006.01) |
| H05K 1/09 | (2006.01) |

(52) U.S. Cl.
CPC ......... *H05K 1/0275* (2013.01); *H05K 1/0213* (2013.01); *H05K 1/09* (2013.01); *H05K 1/18* (2013.01); *H05K 1/0298* (2013.01); *H05K 1/16* (2013.01); *H05K 2201/10053* (2013.01)

(58) Field of Classification Search
CPC ...... H05K 1/0275; H05K 1/0213; H05K 1/18; H05K 1/09; H05K 1/16; H05K 1/0298
See application file for complete search history.

(56) References Cited

U.S. PATENT DOCUMENTS

| | | | | |
|---|---|---|---|---|
| 8,432,300 B2* | 4/2013 | Henry | ..................... | G06F 21/86 341/20 |
| 8,497,444 B2* | 7/2013 | Eck | ....................... | H01H 13/803 200/517 |
| 8,595,514 B2* | 11/2013 | Mirkazemi-Moud | . | G06F 1/1626 340/539.1 |
| 8,662,394 B2* | 3/2014 | Bonnet | ................ | H05K 1/0275 235/439 |
| 9,209,139 B2* | 12/2015 | Salle | ........................ | G06F 21/87 |
| 9,224,280 B2* | 12/2015 | Salle | ..................... | H05K 1/0275 |
| 9,576,450 B2* | 2/2017 | Salle | ...................... | G08B 13/12 |

(Continued)

*Primary Examiner* — Nathan Milakovich
(74) *Attorney, Agent, or Firm* — Muncy, Geissler, Olds & Lowe, P.C.

(57) ABSTRACT

A multi-layered electronic system has: a support substrate which supports at least a primary conductive track and a conductive shorting element, which are electrical isolated from one another. A security layer has at least a conductive security connection and a flexible switch element providing an electrical interruption to the conductive security track. The conductive security connection electrically engages the primary conductive track. The flexible switch element is coplanar with the conductive security connection. A dielectric substrate, to which the security layer is affixed, is secured to the support substrate. The electrical interruption of the conductive security connection is bridged by the switch element contacting the conductive shorting element under an actuation force provided from the direction of the dielectric substrate, the switch element being biased away from the conductive shorting element in the absence of the actuation force.

19 Claims, 3 Drawing Sheets

(56) References Cited

U.S. PATENT DOCUMENTS

| | | | |
|---|---|---|---|
| 9,576,451 B2 * | 2/2017 | Edmonds | G08B 13/128 |
| 2004/0212017 A1 | 10/2004 | Mizuno et al. | |
| 2009/0184850 A1 * | 7/2009 | Schulz | G06F 1/1626 |
| | | | 341/22 |
| 2012/0047374 A1 * | 2/2012 | Klum | G06F 21/86 |
| | | | 713/192 |
| 2014/0306014 A1 * | 10/2014 | Salle | H05K 1/0275 |
| | | | 235/488 |
| 2015/0257259 A1 * | 9/2015 | Morey | H05K 1/181 |
| | | | 174/520 |

* cited by examiner

ANTI-TAMPER DEVICE

CROSS REFERENCE TO RELATED APPLICATIONS

This non-provisional patent application claims priority under 35 U.S.C. §119(a) from Patent Application No. GB1414951.2 filed in The United Kingdom on Aug. 22, 2014, the entire contents of which are hereby incorporated by reference.

FIELD OF THE INVENTION

The present invention relates to a multi-layered electronic system for providing anti-tamper security to an electronic device, and more particularly but not necessarily exclusively to a point of sale (POS) device. The invention further relates to an anti-tamper device including such a multi-layered system.

BACKGROUND OF THE INVENTION

There are many electronic systems for which it is highly undesirable to permit tampering with the circuitry. For instance, any device relating to the security of financial transactions is vulnerable if the circuitry can be tampered with. A bank card reader, such as a point of sale device, for example, could thus be hacked or otherwise compromised to bypass the security and used for criminal purposes.

Many such devices have therefore been created which involve a security circuit; a circuit which is easily broken when tampered and which consequently permanently deactivates the device. Typically the security circuit will take the form of a flexible or deformable layer having conductive connections, typically formed as conductive tracks, on a lower surface which can be laid over a primary circuit. The conductive tracks can be actuated into electrical contact with the primary circuit, thereby completing the circuit. If the device is tampered with, the conductive tracks will be severed, destroying the security circuit, and breaking the connections of the primary circuit.

In the case of a bank card reader, there is a security circuit which covers switching domes. When a keypad button is depressed, the security circuit deforms collapsing the switching dome, shorting together switch contacts on the PCB, located under the centre of the dome and around the outer edge of the dome.

Similar security domes are provided to electrically connect the security circuit to the primary circuit. These domes are held in the operated condition by movable spigots associated with the housing, when the housing is in the closed condition. Opening of the housing moves at least one of these spigots, releasing the associate dome, thereby triggering an alarm condition. This allows a transaction to progress, safe in the knowledge that no third party has interfered with the reader.

In order to be able to effectively complete the security circuit, the keypad button or moveable spigot must be positioned at or adjacent the PCB. Such an arrangement may make it obvious to someone attempting to interfere with the reader as to where the PCB is located within the device, which may in fact aid tampering.

Additionally, such security domes use a dedicated biasing spring positioned between the primary circuit and the security circuit, and typically a plurality of such biasing springs at various positions within the housing or enclosure, which can cause a significant separation force to be imparted to the housing or enclosure. As such, the housing or enclosure has to be suitably formed and robust to prevent or limit the possibility of separation, cracking or splitting over time and during use. The limited available internal space to allow for reinforcement to meet the required robustness necessarily affects where such security devices can be placed within the housing or enclosure.

SUMMARY OF THE INVENTION

Hence there is a desire for an anti-tamper device having a security circuit connection such that the primary circuit can be physically dislocated from the keypad button or moveable spigot, thereby substantially avoiding or obviating the above problems.

According to a first aspect of the invention, there is provided a multi-layered electronic system comprising: a support substrate; at least a primary conductive track and a conductive shorting element supported by the support substrate, the primary conductive track and conductive shorting element being in electrical isolation from one another; a security layer including at least a conductive security connection and a flexible switch element providing an electrical interruption to the conductive security connection, the conductive security connection being in electrical engagement with the primary conductive track, and the flexible switch element being at least in part coplanar with the conductive security connection; and a dielectric substrate on which the security layer is provided, and which is directly or indirectly secured to the support substrate; wherein the electrical interruption of the conductive security connection is bridged by the switch element contacting the conductive shorting element under an actuation force provided from the direction of the dielectric substrate, the switch element being biased away from the conductive shorting element in the absence of said actuation force.

The present invention allows for a security circuit to be integrated with a primary circuit, wherein the security circuit is only completed under a constant actuation force. A shorting element is positioned so as to be physically and electrically isolated from the primary circuit, and the actuation force will thus be effected in the vicinity of the shorting element.

In prior devices, the security circuit is generally brought into physical contact with the primary circuit so as to form a complete circuit. This means that an actuation force must be effected near to the primary circuit, which could feasibly cause damage to the main circuitry, in addition to requiring that the actuation force be in a specific, obvious position, thereby subtly aiding the prospective tamperer.

In the present invention, as the shorting element is dislocated from the primary circuit, the actuation force does not necessarily have to be near the primary circuit, making tampering more difficult. Additionally, the present invention now also only requires a portion of the security circuit to be actuated, making it less likely that damage will occur to the security connection.

The switch element is positioned such that, in the absence of a biasing force, it lies in-line or coplanar with the security connection, that is, forming a planar or contiguous security layer, or where applied to a curved or non-planar substrate, the switch element lies flush with the security connection. This circumvents the issues of prior security elements which relied on spring-biased connection elements, which applied a pressure to the housing of any such device incorporating the security layer. This advantageously allows the present invention to be incorporated into devices which have housings which would have been incapable of withstanding the force of the spring-biased elements, such as those formed with thin walls.

Preferably, the support substrate may include at least a printed circuit board, onto which the primary conductive track is printed.

For ease of mounting the primary conductive track, it is advantageous to provide a printed circuit board, which can be easily integrated into the support substrate of the system.

Preferably, the switch element may comprise at least one flexible electrically conductive element, capable of being actuated into engagement with the conductive shorting element under said actuation force.

A flexible switch element is advantageously less likely to be damaged under actuation than a similar element which may experience more frictional forces during actuation.

Preferably, the dielectric substrate may be at least partially elastic, the switch element being in contact with the dielectric substrate, wherein in the absence of the actuation force, the dielectric substrate biases the switch element away from the conductive shorting element upon returning to its original shape.

An elastic dielectric substrate will advantageously allow the switch element to be biased out of engagement with the shorting element An adhesive layer may be provided to affix the security layer and dielectric substrate to the support substrate.

To prevent abrasive agitation or other dislocation of the security layer and dielectric substrate relative to the support substrate, it is advantageous to adhere them to the substrate. This reduces the likelihood of slippage of the primary and security circuits relative to one another.

Preferably, the electrical interruption of the switch element is an air gap, thereby beneficially providing an electrical insulator between the security connection and shorting element in the tampered condition.

Furthermore, the conductive security connection may be formed as a track which may follow a meandering, tortuous, serpentine or zig-zagged path.

The aim of the security circuit is to prevent illicit tampering with the electronic system. By shaping the conductive security connection to cover a large, randomised area, a criminal cannot knowingly bypass the security layer without risking permanent deactivation of the device by breaking the security connection.

Additionally or alternatively, the security layer may be integrally formed with the dielectric substrate. For example, formed monolithically as a one-piece part of the same structure, or applied thereafter to become to all intents and purposes integrated.

By integrating the security layer of the system with the dielectric substrate, any attempt to detach or peel off the dielectric substrate in order to tamper with the primary circuit of the system will be thwarted, since this will damage or break the security layer in the process.

Preferably, the conductive security connection may cover a majority of the lower surface of the dielectric substrate.

By covering a majority of the dielectric substrate, the conductive security connection may be used to protect the entirety of any protected electronic device from tampering, since damaging any part of the security layer will result in deactivation of the primary circuit as a result.

The primary conductive track may be formed from copper or nickel, and preferably still the conductive security connection may be formed from copper, nickel, silver or gold.

Copper and nickel, and the more expensive silver and gold, are the typical highly electrically conductive metals which are used in circuitry, and the conductive tracks or connections of the circuit will be preferentially formed from one of these metals. However, any suitable electrically conductive material may be utilised, such as graphene or other carbon based materials.

Preferably, the system may further comprise a retaining element overlying the dielectric substrate directly above the switch element, the retaining element applying the actuation force to create physical and electrical contact between the switch element and the conductive shorting element. In this case, the retaining element may beneficially be a spigot.

To further enhance the physical and electrical connection between the security circuit and the shorting element, the retaining element advantageously applies a downward pressure onto the dielectric substrate, compressing the layers beneath together towards the support substrate.

According to a second aspect of the invention, there is provided an anti-tamper electronic device having a case or housing enclosing circuitry, wherein the circuitry of the device includes a multi-layered electronic system, preferably in accordance with the first aspect of the invention. Preferably, at least the dielectric substrate is connected to the case or housing of the electronic device. Furthermore, the support substrate may be integrally formed with the case or housing of the electronic device. In this case, the integration of the support structure with the case or housing may conveniently reduce production costs. The manufacture may be as one-piece, or interconnected so as to essentially form a single structure. There may be further provided a spigot integrally formed with the case or housing of the electronic device to provide the actuation force required to contact the switch element with the conductive shorting element.

An anti-tamper device including the system of the first aspect of the invention will be advantageously protected from illicit use following tampering with the device, since the opening of the case of the device will remove the actuation force which forces the switch element and shorting element into electrical communication.

According to a third aspect of the invention, there is provided a method of deactivating an anti-tamper electronic device, preferably according to the second aspect of the invention, comprising the step of: enclosing the multi-layered electronic system within the case or housing of the device, a portion of the case or housing of the device providing the actuation force to contact the switch element with the conductive shorting element, thereby forming a complete circuit between the primary and security circuits to activate the primary circuit; wherein breaking of the security circuit is effected solely by release of the actuation force and return of the switch element to its unbiased condition.

Ideally, the switch element may return to its unbiased condition under elastic deformation of the dielectric substrate to its original shape.

It is advantageous to deactivate an electronic device when it is being tampered with, since such tampering will usually be for illegal or criminal purposes. In particular, the electronic devices involved with monetary transactions are particularly vulnerable to such tampering, and it would thus be preferable for them to cease to operate than to continue operating in a compromised form.

According to a fourth aspect of the invention, there is provided a method of providing a slimline multi-layered electronic system, preferably in accordance with the first aspect of the invention, comprising the step of providing a conductive security connection and a flexible switch element in line within a security layer.

By providing the conductive security connection, typically being an electrically conductive track, and the switch element inline, rather than utilising a separate spring element to bias the contacts apart on release of an actuation force, a thickness of the security layer can be reduced whilst also decreasing a switch-deformation force.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENTS

Figure 1:
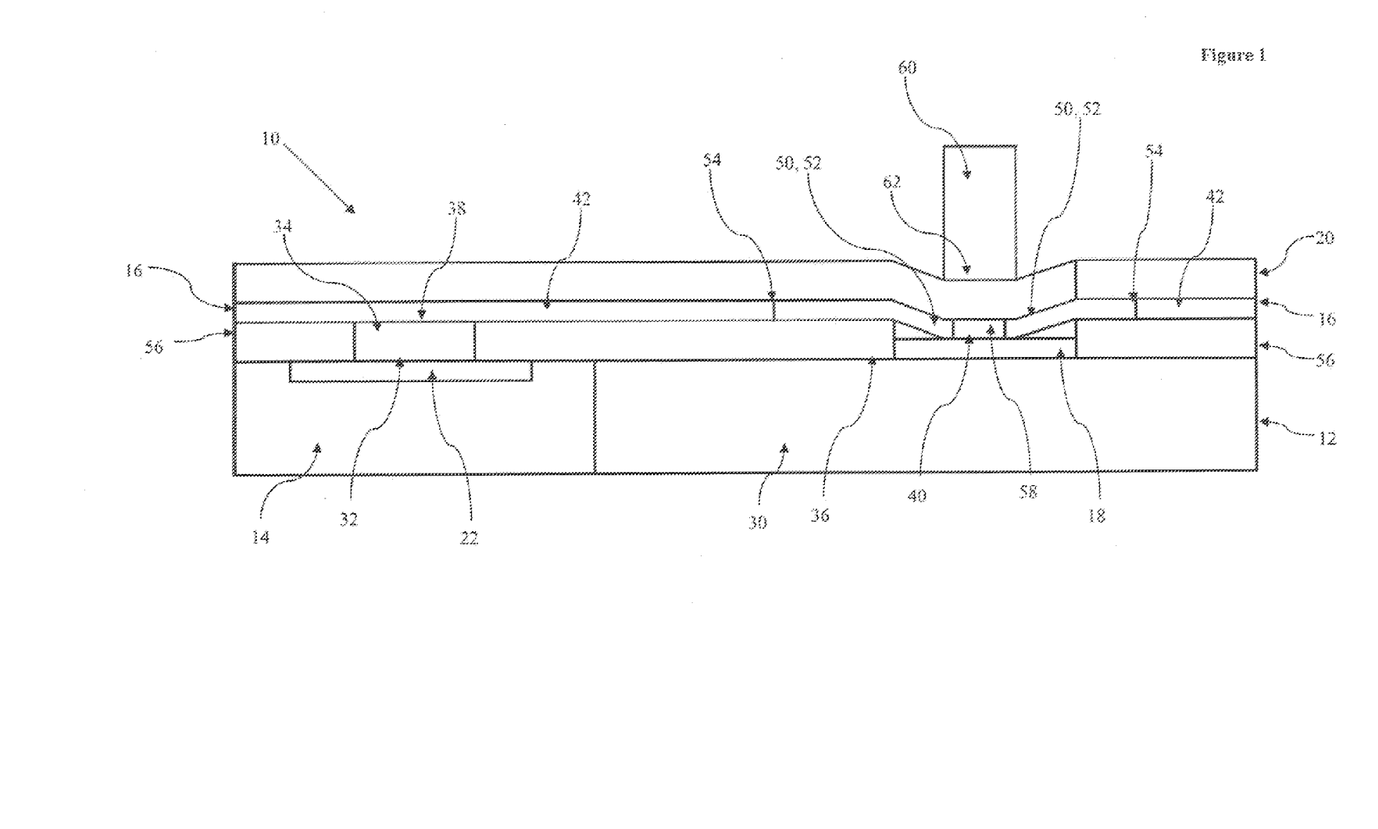
FIG. 1 shows a diagrammatic side cross-sectional view of a first embodiment of a multi-layered electronic system, in accordance with the first aspect of the present invention, the system being in a non-tampered state.
Figure 2:
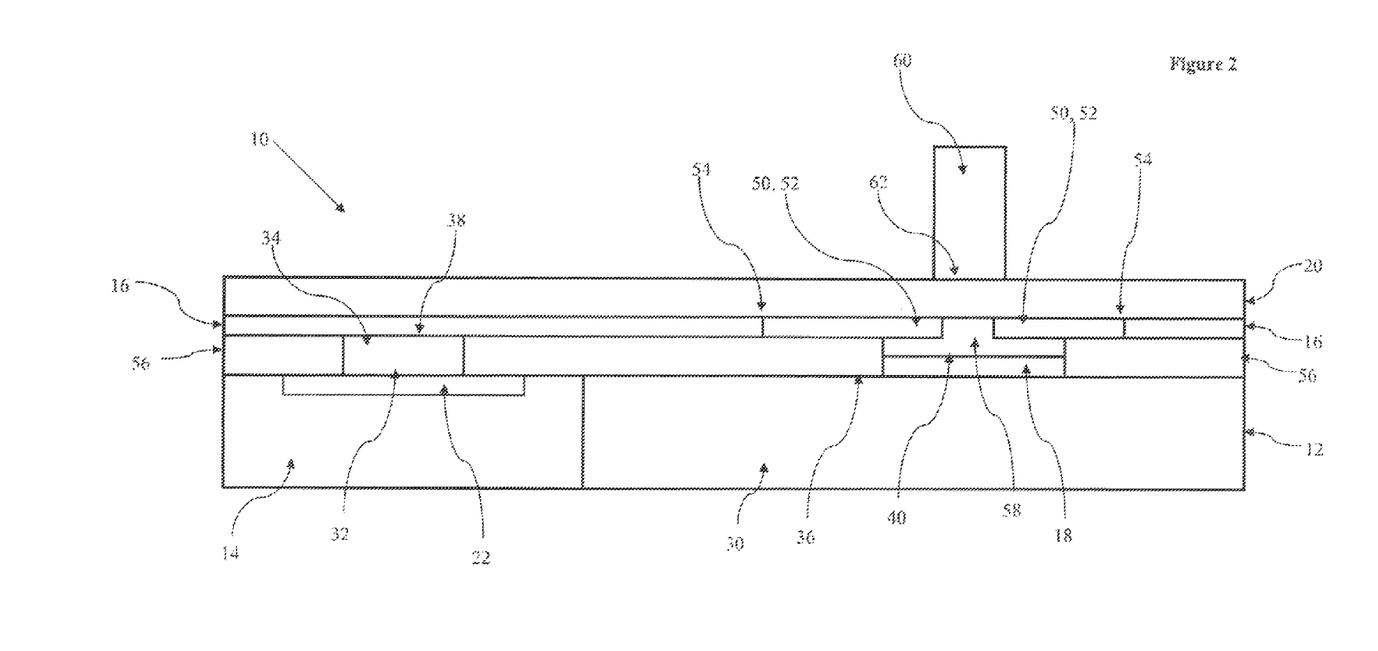
FIG. 2 shows the multi-layered electronic system of FIG. 1 in a tampered state.
Figure 3:
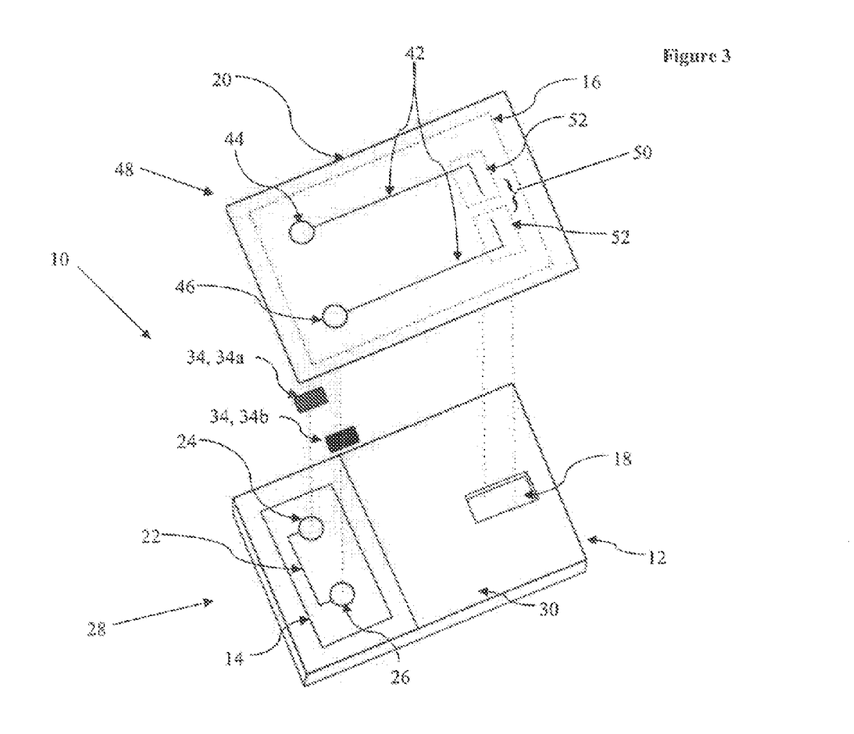
FIG. 3 shows an exploded perspective representation of the multi-layered electronic system of FIG. 1.
Figure 4:
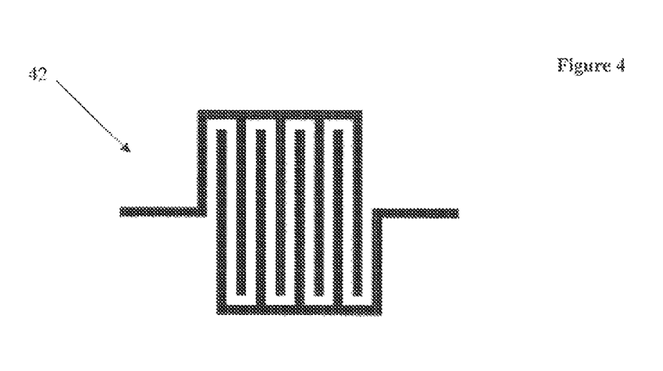
FIG. 4 shows a diagrammatic representation of an embodiment of the conductive security connection of the system.

Referring firstly to FIGS. 1 to 3, there is shown a multi-layered electronic system 10 comprising a support substrate 12, in this instance comprising at least in part a printed circuit board (PCB) 14, a, preferably flexible, security layer 16, a conductive shorting element 18, and a dielectric substrate 20.

The PCB 14 includes at least one primary conductive track 22, which includes the bulk of the functional electronics of the system 10. The track 22 is basically represented in FIG. 3 by way of example only, and terminates in first and second primary terminals 24, 26. The circuitry of the PCB 14 is hereinafter referred to as the primary circuit 28.

The PCB 14 in the present embodiment only forms part of the support substrate 12; a main body 30 of the support substrate 12 is formed from a, preferably rigid, electrically insulative material, such as a plastics material.

Affixed to an upper surface 32 of the PCB 14 are at least two security circuit engagement elements 34 formed from an electrically conductive material, such as solder, or optionally formed as a resistor. To an upper surface 36 of the main body 30 of the support substrate 12 is affixed the electrically conductive shorting element 18, formed from any sufficiently electrically conductive material as a shorting pad, typically being copper, nickel or in this preferred case an electrically conductive printable ink.

The security circuit engagement elements 34 and the electrically conductive shorting pad 18 have substantially parallel upper surfaces 38, 40 spaced from the support substrate 12, with the security circuit engagement elements 34 projecting further than the electrically conductive shorting pad 18. The two surfaces 38, 40 are therefore offset relative to each other, being non-coplanar and thus not lying flush with one another.

The security layer 16 comprises at least one conductive security connection 42, which is preferably formed as a conductive security track and which preferably follows a meandering, serpentine, tortuous or zig-zagged path (not shown in FIG. 3 for clarity) from a first security terminal 44 to a second security terminal 46. Each security terminal 44, 46 is paired with a corresponding primary security terminal 24, 26, the associated terminals 24, 44, 26, 46 being interconnected by respective security circuit engagement elements 34a, 34b.

Typically the conductive security track 42 will be formed from copper, nickel, silver, gold, other precious noble metal or a similarly highly electrically conductive material, again such as a carbon based material, for example, graphene. It will be appreciated that although the security connection 42 is described as a track herein, it could take any appropriate form so as to electrically complete the primary circuit 28 when the security connection 42 is in electrical communication with the electrically conductive shorting pad 18. Printed electronics technology and/or flexible printed circuit technology can be considered, whereby a suitably electrically conductive material can be selected and utilised. The circuitry of the security layer 16 is merely for conductive purposes, and is subsequently referred to as the security circuit 48.

The security layer 16 and the associated security track 42 may cover or substantially cover a majority of a lower surface of the dielectric substrate 20, so as to deter tampering with the security layer 16 via a portion of the system 10 which contains no portion of the security track 42. In order to achieve this, the security layer 16 may be integrally formed with the dielectric substrate 20, wherein the security layer 16 is, for example, formed onto the dielectric substrate 20 using a deposition process.

The security layer 16 further includes a flexible switch element 50. This switch element 50 comprises at least one, and preferably two, as shown in the depicted embodiment, moveable portions 52 which are in electrical communication and inline with the security track 42. These moveable portions 52 may be integrally or, as shown, separately formed with the security track 42 as a flexible electrically conductive element, connected at internal security terminals 54. The moveable portions 52 are physically separate, however, so as to provide an electrical interruption within the security track 42.

The moveable portions 52 are able to flex, actuate or otherwise move under the application of an actuating force, and therefore may be formed from a flexible or deformable electrically conductive material, for example. This movement occurs towards the shorting pad 18, and therefore the switch element 50 is positioned in the security layer 16 adjacent or near the shorting pad 18.

To retain the security layer 16 against the support substrate 12, the dielectric substrate 20 is provided. The security layer 16 is affixed to the dielectric substrate 20, typically as a printed or otherwise deposited layer, and the dielectric substrate 20 therefore acts as a carrier for the security layer 16. Once the dielectric substrate 20 is secured to the support substrate 12, contact of the security layer 16 with the primary conductive track 22 is ensured, adhesive retention being achieved by using a suitable adhesive layer 56. However, in the region around the shorting element 18 and switch element 50, no adhesive is used, therefore providing an air gap 58 around the shorting element 18.

The dielectric substrate 20 is both flexible and elastic, being formed from any such suitable material, typically a dielectric material, such as a polyimide. This dielectric substrate 20 thereby acts as a mechanical support for the underlying security layer 16. The dielectric substrate 20, when in position, is stretched over a large proportion of the support substrate 12. The security layer 16 is secured to the support substrate 12 using the adhesive layer 56, except at or adjacent to the switch element 50, which is held in place by the contacting portion of the dielectric substrate 20.

As a result of the shorting pad 18 being recessed relative to the security circuit engagement elements 34 with the air gap 58 there between, the natural tension of the dielectric substrate 20 will ensure that the layer lies in a single plane. The moveable portions 52 of the switch element 50, being in communication with the dielectric substrate 20 will therefore be biased away from the shorting pad 18, subsequently lying out of electrical and physical communication. This biasing of the dielectric substrate 20 may be achieved by forming the layer 20 from a material which is at least in part elastic, thereby allowing it to return or deform back to its original shape in the absence of a deformation force or pressure. Therefore, in the absence of any such biasing force, the switch element 50 lies inline and coplanar with the security connection 42.

In use, the multi-layered electronic system 10 will be installed as part of an anti-tamper electronic device. Such a device will typically have a main body which encloses the system 10, providing initial protection from tampering. Such anti-tamper devices might, for instance be banking card readers, for example, a point of sale (POS) device, wherein security is a major concern for both users and vendors.

The main body of the anti-tamper device has mounting means by which the multi-layered electronic system 10 can be mounted therein, and in particular, may have a retaining means which at least in part imparts an activation force upon the system 10. This retaining means may, for instance, be a spigot 60 which projects inwardly from the main body, contacting a portion of the system 10.

Such a spigot 60 may be configured such that a distal end 62 contacts a portion of the dielectric substrate 20 at or adjacent to the actuatable switch element 50. Under normal operating conditions wherein the main body of the anti-tamper electronic device is untampered with, the spigot 60 will apply a retaining force urging the dielectric substrate 20 and therefore the switch element 50 in the direction of the conductive shorting element 18.

In this manner, the or each moveable portion 52 of the switch element 50 is brought into resilient and reliable contact with the shorting contact element 18. The electrical interruption of the conductive security track 42 is therefore bridged, completing a full circuit through the primary and security tracks 22, 42. As such, the primary circuit 28 is made operational.

Under said normal operating conditions, the anti-tamper electronic device is thus made functional by the activation of the primary circuit 28, the spigot 60 forcibly retaining the connection between the primary and security tracks 22, 42 by the position of the main body of the device.

However, should the anti-tamper electronic device be tampered with in any way, then the compressive retaining force of the spigot 60 will be released as the main body is opened. Under such conditions, the dielectric substrate 20 will return to its unbiased planar configuration, taking the moveable portions 52 of the switch element 50 out of contact with the conductive shorting element 18.

To further aid with the anti-tamper properties of the electronic device, the dielectric substrate 20 may be connected to the main body of the device, such that opening of the device pulls the dielectric substrate 20 to such an extent so as the break the connection of the security layer 16. Similarly, the support substrate 12 may be mounted to the main body of the device to better effect the separation of the primary and security circuits 28, 48 on opening of the device casing.

As such, the flow of current in the primary circuit 28 is broken when the device is tampered with; the primary circuit 28 is only completed when the security circuit 48 is uninterrupted, and release of the retaining force breaks the bridge formed in the security track 42 when the actuatable switch element 50 is in contact with the conductive shorting element 18, leaving only an electrical interruption.

It is therefore possible to deactivate an anti-tamper electronic device having such a multi-layered electronic system 10 by tampering with a case or housing of the device, to thereby release an actuation force on the switch element 50, breaking the current flow through an electronic circuit formed by the combination of the primary and security circuits 28, 48.

It will be appreciated that although the above-described anti-tamper electronic device is described as having a single multi-layered electronic system included to provide anti-tamper capability, that in practice, a plurality of said systems may be included in a single device so as to ensure that the anti-tamper properties cannot be easily circumvented. The systems may be separate and thus independent of each other, being activated by a common housing or enclosure, or may be integrally formed together with one or more common or shared substrates and/or cover layers.

This point goes to the heart of the present invention; a plurality of electrical interruptions and respective shorting elements can be provided as part of the security circuit, with a plurality of associated spigots engagable therewith to provide the retaining force. These spigots can be spaced around the main body, casing or housing of the anti-tamper electronic device so as to provide anti tamper protection around the whole of the device. This is only achievable in the present invention, since the location in which the retaining force needs to be applied is physically dislocated from the PCB itself. This advantageously secures a greater extent of the device, preventing any undesirable tampering to occur through parts of the device which do not contain the main portion of PCB.

Furthermore, the retaining means of the anti-tamper device do not necessarily have to be spigots, nor do they necessarily have to be integrally formed with the case or housing of the anti-tamper device, in order to provide the necessary retaining force to complete the circuit.

The actuatable switch element has been hereinbefore described as having flexible electrically conductive elements which are capable of being moved into electrical communication with the conductive shorting element. However, any appropriate actuatable element could be used, for instance, a pivotable rather than a flexible element, in order to effect electrical engagement. However, a significant benefit of the currently described arrangement over the prior art in the field is the omission of a separate biasing spring. The present invention, by the omission of the dedicated return springs, significantly reduces the separation forces imparted internally within the housing or enclosure, thus reducing the requirement for internal reinforcement and consequently allowing greater positionable freedom.

Additionally, whilst the shorting element is described as being connected to and recessed into the support substrate in order to distance the switch element from the shorting element in the unbiased condition, it is also possible to physically connect the shorting element to the security layer instead, provided that the shorting element could be electrically isolated from the conductive security connection. This could be achieved by, for example, attachment of the shorting element to security layer using a non-conductive adhesive layer. In such an arrangement, the security circuit could be manufactured inclusive of the shorting element, and subsequently attached to the support substrate including the primary circuit.

It is therefore possible to provide a slimmer multi-layered electronic system which includes a security layer of reduced thickness having a portion which is actuatable under an external force so as to contact with a shorting element. This shorting element completes a primary circuit of the multi-layered electronic system, allowing it to complete its primary function. The circuit will only be thus completed under the application of said external force, which may be provided by the main case or housing of any anti-tamper device containing the multi-layered electronic system, and therefore, the primary circuit will be deactivated when the external force is lost, that is, when the multi-layered electronic system is tampered with.

Such a system is capable of detecting tampering of the primary circuit or the housing in which it is contained, thereby discouraging illegal or undesirable tampering with the system, whilst not requiring the PCB circuitry of the primary circuit to be positioned in a specific location within said housing in order to maintain activation thereof. This advantageously requires a reduced external force to be provided from the housing to activate the switch element of the system, enabling devices not previously capable of sufficient actuation forces to utilise the present anti-tamper technology.

In the description and claims of the present application, each of the verbs "comprise", "include", "contain" and "have", and variations thereof, are used in an inclusive sense, to specify the presence of the stated item or feature but do not preclude the presence of additional items or features.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments described above are provided by way of example only, and various other modifications will be apparent to persons skilled in the field without departing from the scope of the invention as defined by the appended claims.

The invention claimed is:

1. A multi-layered electronic system comprising:
   a support substrate;
   a primary conductive track and a conductive shorting element supported by the support substrate, the primary conductive track and conductive shorting element being in electrical isolation from one another;
   a security layer including at least a conductive security connection and a flexible switch element providing an electrical interruption to the conductive security connection, the conductive security connection being in electrical engagement with the primary conductive track, and the flexible switch element being at least in part coplanar with the conductive security connection; and
   a dielectric substrate on which the security layer is provided, and which is directly or indirectly secured to the support substrate;
   wherein the electrical interruption of the conductive security connection is bridged by the switch element contacting the conductive shorting element under an actuation force provided from the direction of the dielectric substrate, the switch element returning to an unbiased condition out of electrical contact with the conductive shorting element in the absence of said actuation force.

2. The multi-layered electronic system of claim 1, wherein the support substrate includes at least a printed circuit board, onto which the primary conductive track is printed.

3. The multi-layered electronic system of claim 1, wherein the switch element comprises at least one flexible electrically conductive element, capable of being actuated into engagement with the conductive shorting element under said actuation force.

4. The multi-layered electronic system of claim 1, wherein the dielectric substrate is at least partially elastic, the switch element being in contact with the dielectric substrate, wherein in the absence of the actuation force, the dielectric substrate biases the switch element away from the conductive shorting element upon returning to its unbiased condition.

5. The multi-layered electronic system of claim 1, wherein an adhesive layer is provided to affix the security layer and dielectric substrate to the support substrate.

6. The multi-layered electronic system of claim 1, wherein the electrical interruption of the conductive security connection is an air gap.

7. The multi-layered electronic system of claim 1, wherein the conductive security connection is formed as a track following a meandering, tortuous, serpentine or zig-zagged path.

8. The multi-layered electronic system of claim 1, wherein the security layer is integrally formed with the dielectric substrate.

9. The multi-layered electronic system of claim 1, wherein the conductive security connection covers a majority of a lower surface of the dielectric substrate.

10. The multi-layered electronic system of claim 1, wherein the primary conductive track is formed from copper or nickel.

11. The multi-layered electronic system of claim 1, wherein the conductive security connection is formed from copper, nickel, silver or gold.

12. The multi-layered electronic system of claim 1, wherein the conductive shorting element is integrally formed with the support substrate.

13. The multi-layered electronic system of claim 1, wherein the conductive shorting element is affixed to the security layer using a non-electrically-conductive adhesive.

14. The multi-layered electronic system of claim 1, further comprising a retaining element overlying the dielectric substrate directly above the switch element, the retaining element applying the actuation force to create physical and electrical contact between the switch element and the conductive shorting element.

15. The multi-layered electronic system of claim 14, wherein the retaining element is a spigot.

16. An anti-tamper electronic device having a housing enclosing circuitry, wherein the circuitry of the device includes the multi-layered electronic system of claim 1.

17. The anti-tamper electronic device of claim 16, wherein at least the dielectric substrate is connected to the housing of the electronic device.

18. The anti-tamper electronic device of claim 16, wherein the support substrate is integrally formed with the housing of the electronic device.

19. The anti-tamper electronic device of claim 16, wherein a spigot is integrally formed with the housing of the electronic device to provide the actuation force required to contact the switch element with the conductive shorting element.

\* \* \* \* \*